United States Patent
Sorin et al.

(10) Patent No.: US 10,033,159 B2
(45) Date of Patent: Jul. 24, 2018

(54) MODE-CONTROLLED LASER SYSTEM

(71) Applicant: Hewlett-Packard Development Company, L.P., Houston, TX (US)

(72) Inventors: Wayne Victor Sorin, Mountain View, CA (US); Michael Renne Ty Tan, Menlo Park, CA (US); David A. Fattal, Mountain View, CA (US); Marco Fiorentino, Mountain View, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/785,419

(22) PCT Filed: Jun. 20, 2013

(86) PCT No.: PCT/US2013/046842
§ 371 (c)(1),
(2) Date: Oct. 19, 2015

(87) PCT Pub. No.: WO2014/204468
PCT Pub. Date: Dec. 24, 2014

(65) Prior Publication Data
US 2016/0072256 A1    Mar. 10, 2016

(51) Int. Cl.
*H01S 5/12*    (2006.01)
*H01S 5/183*    (2006.01)
(Continued)

(52) U.S. Cl.
CPC ...... *H01S 5/18386* (2013.01); *H01S 5/02284* (2013.01); *H01S 5/18319* (2013.01);
(Continued)

(58) Field of Classification Search
CPC ............ H01S 2301/18; H01S 2301/20; H01S 2301/203; H01S 2301/206; H01S 5/18386; H01S 5/18319
See application file for complete search history.

(56) References Cited

U.S. PATENT DOCUMENTS

| 7,376,169 B2 | 5/2008 | Henrichs |
| 2004/0160998 A1 | 8/2004 | Gruhlke et al. |

(Continued)

FOREIGN PATENT DOCUMENTS

| JP | 10-004243 A | 1/1998 |
| JP | 2008283028 A | 11/2008 |

(Continued)

OTHER PUBLICATIONS

International Search Report & Written Opinion received in PCT Application No. PCT/US2013/046842, dated Mar. 31, 2014, 12 pages.

(Continued)

*Primary Examiner* — Tod T Van Roy
(74) *Attorney, Agent, or Firm* — Tarolli, Sundheim, Covell & Tummino L.L.P.

(57) ABSTRACT

A mode-controlled laser system includes an active region to generate optical energy in response to an electric signal. The system also includes a mirror to resonate the optical energy in an optical cavity. The system also includes a HCG mode control reflector arranged in the optical cavity to control the resonated optical energy into a substantially non-Gaussian intensity profile. The resonated optical energy can be emitted as an optical signal having the substantially non-Gaussian intensity profile.

18 Claims, 5 Drawing Sheets

(51) Int. Cl.
  *H01S 5/022* (2006.01)
  *H01S 5/10* (2006.01)
(52) U.S. Cl.
  CPC .......... *H01S 5/105* (2013.01); *H01S 2301/18* (2013.01); *H01S 2301/203* (2013.01)

(56) References Cited

U.S. PATENT DOCUMENTS

| | | |
|---|---|---|
| 2008/0304535 A1 | 12/2008 | Parriaux et al. |
| 2009/0097522 A1 | 4/2009 | Justice et al. |
| 2011/0261856 A1* | 10/2011 | Fattal .................. H01S 5/18363 372/46.012 |
| 2012/0120977 A1 | 5/2012 | Fattal et al. |
| 2012/0147912 A1* | 6/2012 | Moench .................... H01S 5/14 372/29.02 |
| 2012/0189024 A1 | 7/2012 | Fattal et al. |
| 2013/0058370 A1* | 3/2013 | Chang-Hasnain ..... B82Y 20/00 372/50.11 |
| 2014/0353530 A1* | 12/2014 | Chang-Hasnain H01L 31/02327 250/552 |

FOREIGN PATENT DOCUMENTS

| | | |
|---|---|---|
| KR | 20120047288 A | 5/2012 |
| KR | 20130048628 A | 5/2013 |
| WO | WO-2011142760 A1 | 11/2011 |
| WO | WO-2012144997 | 10/2012 |

OTHER PUBLICATIONS

Rao, Y., "InP-based Long Wavelength VCSEL using High Contrast Grating," (Research Paper), Electrical Engineering and Computer Sciences, University of California at Berkeley, Dec. 14, 2012, 103 pages, available at http://www.eecs.berkeley.edu/Pubs/TechRpts/2012/EECS-2012-261.pdf.

Extended European Search Report dated Feb. 8, 2017 for EP Application No. 13887305.4; pp. 9.

International Preliminary Report on Patentability received in PCT Application No. PCT/US2013/046842, dated Dec. 30, 2015, 9 pages.

\* cited by examiner

MODE-CONTROLLED LASER SYSTEM

BACKGROUND

Optical communications have become more prevalent as the demand for high-speed communication and processing has increased. Data communication links can include optical coupling of an optical signal to an optical fiber or waveguide via a laser to provide the optical signal to a destination device for processing. Data communication links for communication speeds of 10 gigabits per second (Gbps) can be implemented to have a coupling efficiency that is substantially low (e.g., approximately 6 dB) due to eye safety requirements. Data communication links can be implemented for higher speeds (e.g., 25 Gbps), but may require greater coupling efficiency to substantially mitigate receiver noise and modulation extinction ratios, and may be limited to use in backplane applications to remove the eye safety requirement based on the higher coupling efficiency.

DETAILED DESCRIPTION

Figure 1:
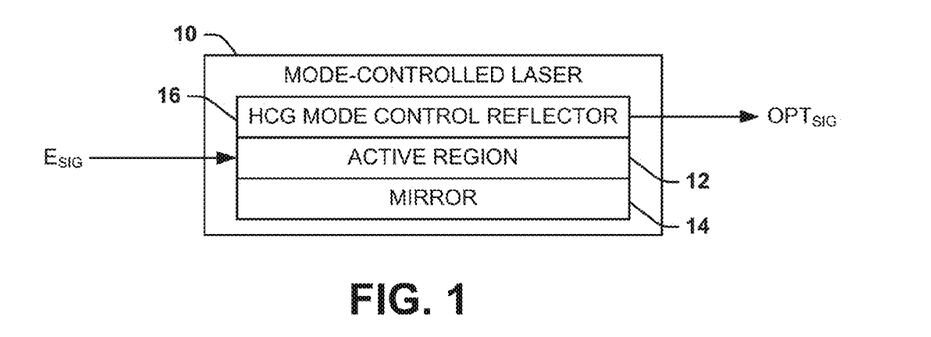
FIG. 1 illustrates an example of a mode-controlled laser system.

FIG. 1 illustrates an example of a mode-controlled laser system 10. The mode-controlled laser system 10 can be implemented in any of a variety of optical communications systems to generate a modulated optical signal $OPT_{SIG}$. The mode-controlled laser system 10 can be implemented, for example, as a spatially single-mode or multi-mode laser, such as a vertical-cavity surface-emitter laser (VCSEL). For example, the mode-controlled laser system 10 can be implemented in an optical device package as an optical transmitter system that can be mounted on a backplane or printed circuit board (PCB) to provide high-speed optical communication in a computer system. As an example, the mode-controlled laser system 10 can be implemented in a high speed (e.g., 25 Gbps or more) optical communications system.

The mode-controlled laser system 10 includes an active region 12 configured to generate optical energy in response to an electric signal $E_{SIG}$, such as can be implemented to modulate the optical signal $OPT_{SIG}$. The mode-controlled laser system 10 also includes at least one mirror 14 and a high-contrast grating (HCG) mode control element 16. The mirror 14 is configured to resonate the optical energy in an optical cavity that is defined within a volume of the mode-controlled laser system 10. For example, the mirror 14 can be configured as a distributed Bragg reflector (DBR), such as including a plurality (e.g., twenty-five or more) of layers of alternating materials having separate indices of refraction. Thus, the mirror 14 can be approximately 99% or more reflective.

The HCG mode control reflector 16 can be configured as a planar HCG reflector comprising a plurality of resonant structures composed of a material having a high index-of-refraction. As an example, the material having the high-index of refraction can have a difference between the index-of-refraction of the resonant structures and the index-of-refraction of a surrounding material that is greater than or equal to one. As another example, the plurality of resonant structures can have a dimension (e.g., width) that is sub-wavelength of the optical energy resonating therein. Therefore, the optical cavity can include the mirror 14 and the HCG mode control reflector 16, such that the optical cavity can be defined by a dimension (e.g., distance) between the mirror 14 and the HCG mode control reflector 16 to resonate the optical energy between the mirror 14 and the HCG mode control reflector 16.

The plurality of resonant elements of the HCG mode control reflector 16 can be configured to selectively phase-delay and provide amplitude control of portions of the optical energy that is incident thereon to provide optical mode control of an intensity profile of the optical energy. As an example, the mode-controlled intensity profile can be arranged as a substantially non-Gaussian intensity profile. As described herein, a substantially non-Gaussian intensity profile is an intensity profile that is not Gaussian with respect to a central axis of the optical signal $OPT_{SIG}$, such that a maximum intensity of the optical signal $OPT_{SIG}$ is not centered on the central axis of the optical signal $OPT_{SIG}$. As an example, the non-Gaussian intensity profile can be a substantially off-axis intensity profile, such that the optical energy of the optical signal $OPT_{SIG}$ is substantially minimized at the central axis of the optical signal $OPT_{SIG}$ (e.g., an approximate ring shape). As another example, the non-Gaussian intensity profile can be a single-mode intensity profile, such as generated in the active region 12. The optical signal $OPT_{SIG}$ can be emitted, for example, from the HCG mode control reflector 16 having the substantially non-Gaussian intensity profile (see, e.g., FIG. 2).

Figure 2:
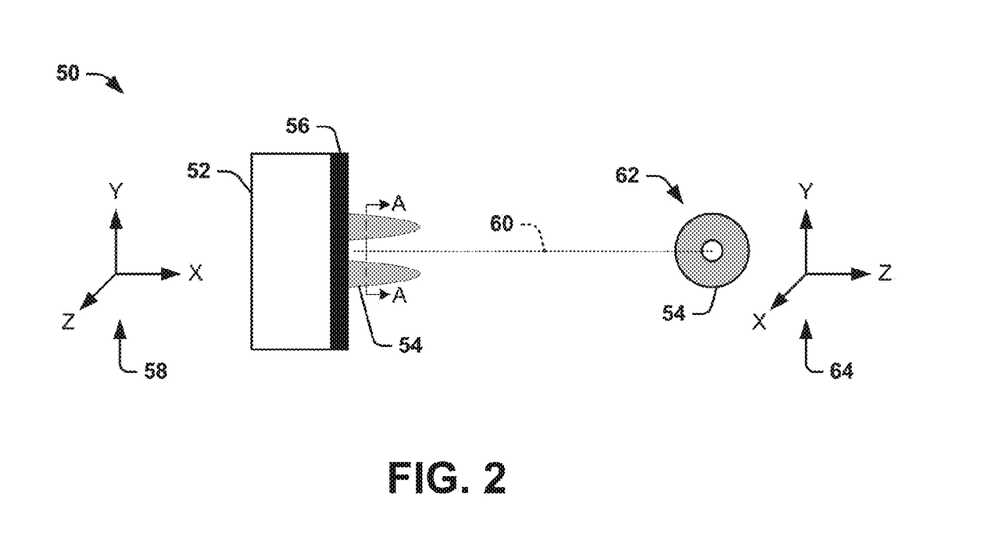
FIG. 2 illustrates an example diagram of mode control.

FIG. 2 illustrates an example diagram 50 of mode control. The diagram 50 is demonstrated in a plan view and includes a VCSEL 52 that is configured to generate an optical signal 54 that is emitted from an HCG mode control reflector 56 (e.g., substantially similar to the HCG mode control reflector 16). The VCSEL 52 and the optical signal 54 are demonstrated in the example of FIG. 2 in an XY planar view based on a Cartesian coordinate system demonstrated at 58. The optical signal 54 is demonstrated as exhibiting a substantially non-Gaussian intensity profile, such that the optical energy of the optical signal 54 is substantially mitigated with respect to a central axis 60 (e.g., corresponding to an approximate ring-shaped intensity profile). The optical signal 54 in the Cartesian coordinate system 58 is demonstrated in a cross-sectional view 62, such as taken along line A-A of the signal 54, in an YZ planar view based on a Cartesian coordinate system demonstrated at 64. In the example of FIG. 2, the substantially non-Gaussian intensity profile is demonstrated as an approximate ring shape. However, it is to be understood that the substantially off-axis intensity profile can be exhibited in any of a variety of other types of shapes. For example, the substantially non-Gaussian intensity profile can have an outer and/or inner diameter cross-sectional shape other than substantially circular, such as square, rectangular, hexagonal, or a variety of other shapes.

As another example, the reflected mode-controlled intensity profile could be an interrupted pattern that substantially surrounds an approximate center point, such as lobes or other patterns, to substantially maintain mode control.

Referring back to the example of FIG. 1, based on the mode control of the optical energy internal to the mode-controlled laser system 10, the mode-controlled laser system 10 can be implemented to generate the optical signal $OPT_{SIG}$ at a substantially greater optical power than a typical single-mode VCSEL system. In the example of FIGS. 1 and 2, a significantly large mode volume of the active region 12 can be utilized to generate the optical energy that resonates in the optical cavity of the mode-controlled laser system 10, thus allowing emission of substantially all of the optical energy in the controlled modes of the substantially non-Gaussian intensity profile (e.g., from the HCG mode control reflector 16). Thus, the emission of the optical signal $OPT_{SIG}$ can therefore be substantially similar to multi-mode optical emission with respect to optical power. Additionally, as described in greater detail herein, the substantially non-Gaussian intensity profile can be focused to a different intensity profile (e.g., a single-mode intensity profile) that can have a significantly greater optical power than optical signals generated by typical single-mode VCSEL systems (e.g., single-mode Gaussian optical signals) based on the limited active region volume and/or aperture dimension of typical VCSELs (e.g., typical Gaussian single-mode VCSELs). Accordingly, the mode-controlled laser system 10 can exhibit significantly greater power efficiency than typical VCSEL systems, such as can be implemented to provide high-speed (e.g., 25 Gbps or more) optical communications.

Figure 3:
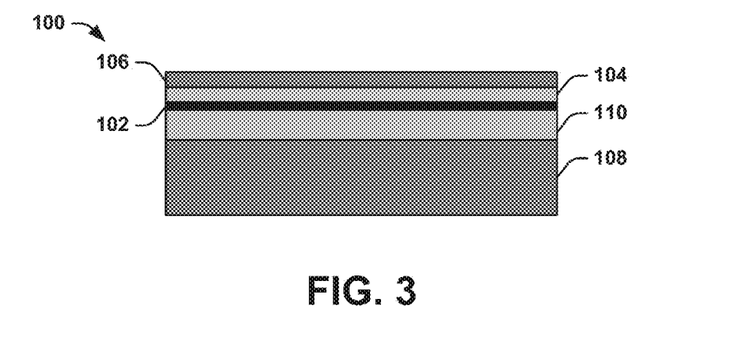
FIG. 3 illustrates an example of a mode-controlling VCSEL.

FIG. 3 illustrates an example of a mode-controlling VCSEL 100. The VCSEL 100 can correspond to the mode-controlled laser system 10 in the example of FIG. 1. Therefore, reference is to be made to the example of FIGS. 1 and 2 in the following description of the example of FIG. 3. The VCSEL 100 can be fabricated, for example, on a wafer as one of a plurality of VCSELs that are fabricated together in an array. As an example, the VCSELs in the array, including the VCSEL 100, can all have an approximately equal diameter (e.g., 8 μm), and can be separated from each other by a substantially greater distance (e.g., 250 μm). The VCSEL 100 includes an active region layer 102 configured to generate optical energy in response to an electric signal (e.g., the electric signal $E_{SIG}$ in the example of FIG. 1), such as can be implemented to modulate an optical output signal (e.g., the optical signal $OPT_{SIG}$). The VCSEL 100 also includes a mirror layer 104 that can be configured as a highly-reflective DBR mirror, such as can achieve a reflectivity of approximately 99% or more.

The VCSEL 100 also includes an HCG mode control layer 106 that can be patterned on a substrate 108. For example, The HCG mode control layer 106 can be configured as a reflector comprising a plurality of resonant structures composed of a material having a high index-of-refraction. The plurality of resonant structures can be formed from a variety of high index-of-refraction materials, such as amorphous silicon, gallium arsenide (GaAs), or indium phosphide (InP). As an example, the substrate 108 can be a semiconductor material (e.g., GaAs or InP). For example, the plurality of resonant structures can be surrounded by air, or can be surrounded by another material having an index-of-refraction that is less than the index-of-refraction of the resonant structures by at least one. That is, a difference between an index-of-refraction of the material of the resonant structure and an index-of-refraction of the surrounding material can be greater than or equal to one. As an example, the resonant structures can be arranged on a surface of the HCG mode control layer 106 based on a gradient pattern. As such, the HCG mode control layer 106 can exhibit phase-delays and amplitude control differently for optical energy incident on the separate portions of the gradient pattern to implement mode control.

In some examples, such as shown in FIG. 3, the VCSEL 100 can include an additional mirror layer 110. The additional mirror layer 110 can be configured as a DBR reflector having a lesser number of layers than the mirror layer 104 (e.g., five or less layers), such as sufficient to achieve a high total reflectivity with the HCG mode control layer 106 (e.g., approximately 99% or greater). The additional mirror layer 110 can be arranged over the HCG mode control layer 106, as demonstrated in the example of FIG. 3, can be arranged between the substrate 108 and the HCG mode control layer 106, or can be obviated based on the reflectivity of the HCG mode control layer 106. Additionally, it is to be understood that implementing the HCG mode control layer 106 as a reflector, with or without the additional mirror layer 110, can result in a reflector that has significantly less thickness than a typical DBR reflector having a substantially comparable reflectivity. As a result, the VCSEL 100 implementing the HCG mode control layer 106 as a reflector can have a faster modulation response time than a typical VCSEL.

The mirror layer 104 and the additional mirror layer 110 and/or the HCG mode control layer 106 can thus form a resonant optical cavity in the VCSEL 100. Thus, the optical energy that is generated in the active region layer 102 can thus resonate in the optical cavity and be emitted from the VCSEL 100 (e.g., via the HCG mode control layer 106). In the example of FIG. 3, the VCSEL 100 can be configured to emit the optical energy from the HCG mode control layer 106. However, it is to be understood that the VCSEL 100 could instead emit the optical energy through the substrate in a reverse VCSEL arrangement. Based on the mode-controlling features of the resonant structures of the HCG mode control layer 106, the optical energy can be emitted as an optical signal (e.g., the optical signal $OPT_{SIG}$) having a substantially non-Gaussian intensity profile, such as disclosed herein.

Figure 4:
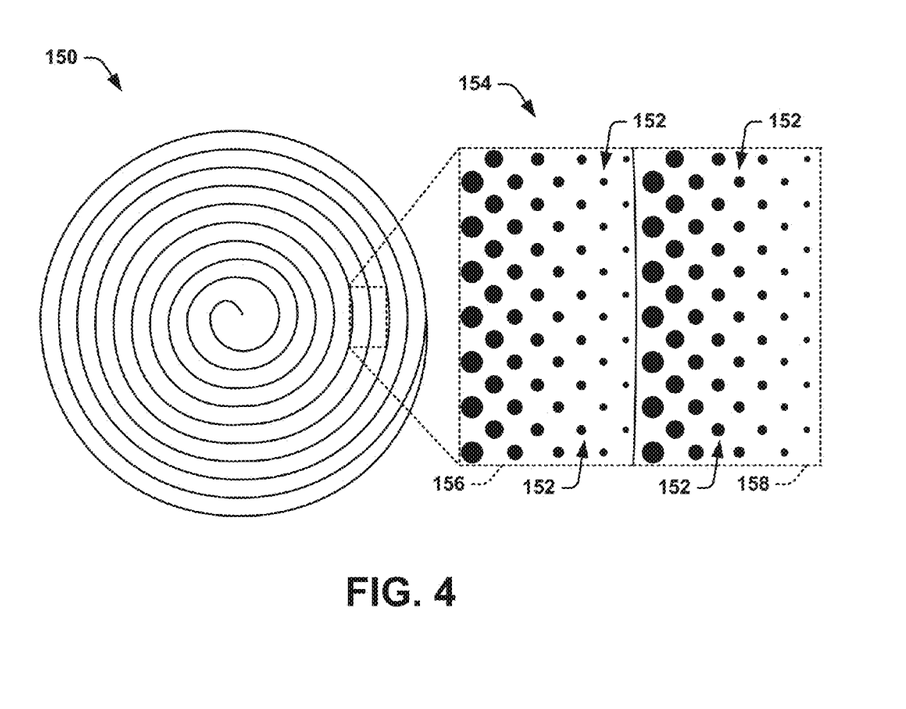
FIG. 4 illustrates an example of an HCG mode-control element.

As described previously, the respective reflected phase-delay and amplitude control of the portions of the optical energy resonating in the optical cavity can result from the manner in which the HCG mode control layer 106 is fabricated. FIG. 4 illustrates an example of a HCG mode control reflector 150. The HCG mode control reflector 150 can correspond to the HCG mode control reflector 16 in the example of FIG. 1 and/or the HCG mode control layer 106 in the example of FIG. 3. Therefore, reference is to be made to the examples of FIGS. 1 through 3 in the following description of the example of FIG. 4. In the example of FIG. 4, the HCG mode control reflector 150 is demonstrated in a top-view of a substantially planar surface of the HCG mode control reflector 150. The HCG mode control reflector 150 is demonstrated as circular in the top view of the example of FIG. 4. However, the HCG mode control reflector 150 can instead have a variety of different geometric shapes. As an example, the HCG mode control reflector 150 can have a diameter sufficient to provide selective phase-delay and reflected amplitude control of substantially all or most of the resonating optical energy.

The HCG mode control reflector 150 includes a layer of a high index-of-refraction material (e.g., amorphous silicon) provided as a plurality of resonant structures that are substantially defined by a plurality of gradient patterns to provide mode control of incident optical energy. In the example of FIG. 4, the HCG mode control reflector 150 is demonstrated as having the resonant structures arranged as a spiral pattern defined as having a plurality of gradient patterns (e.g., loops) along a radius of the HCG mode control reflector 150. As described herein, a loop of the spiral pattern is a given portion of the spiral pattern that traverses 360° around the center of the spiral pattern from a given angle, and thus the loop ends a greater distance along the radius of the HCG mode control reflector 150 relative to the start of the loop. In the example of FIG. 4, the plurality of resonant structures can be provided as a plurality of posts 152 that are arranged as having a thickness (i.e., wafer layer thickness) that is substantially uniform. For example, the thickness of the plurality of posts 152 that constitute the approximate spiral pattern in the example of FIG. 4 can have a thickness that depends on the wavelength of the light constituting the resonating optical energy. As an example, the high index-of-refraction posts 152 can be surrounded by air, or can be surrounded by another material having an index-of-refraction that is less than the index-of-refraction of the posts 152 by at least one. Accordingly, the posts 152 cooperate to control the optical modes of the resonating optical energy based on the portions of the light resonating in the posts 152 to provide selective phase-delay and amplitude control of the resonating optical energy.

In the example of FIG. 4, the posts 152 are demonstrated as approximately cylindrical (i.e., round in the top-view of the example of FIG. 4) in an exploded view 154. For example, the posts 152 can be formed by etching the layer of the high index-of-refraction material. The posts 152 in each gradient pattern (e.g., loop) of the spiral pattern can have a width (e.g., cross-sectional diameter) that is a function of an approximate gradient of decreasing size from center of the HCG mode control reflector 150 to a periphery of the HCG mode control reflector 150. The width of the posts 152 can be sub-wavelength with respect to the light of the resonating optical energy, and can be selected to provide selective phase-delay of the resonating optical energy, such as to provide an angular momentum to generate the approximately ring-shaped intensity profile. For example, the width of the posts 152 can range, for example, from approximately 100 nm to approximately 400 nm. The exploded view 154 demonstrates an inner loop 156 and an adjacent outer loop 158 on which the posts 152 are pattern-etched. The inner loop 156 and the outer loop 158 each include posts 152 that each have a width that decreases from left-to-right (e.g., from center of the HCG mode control reflector 150 to the outer periphery of the HCG mode control reflector 150). Accordingly, the resonating optical energy can resonate within the posts 152 to provide the selective phase-delay of the resonating optical energy, such as to provide the approximately ring-shaped intensity profile.

Figure 5:
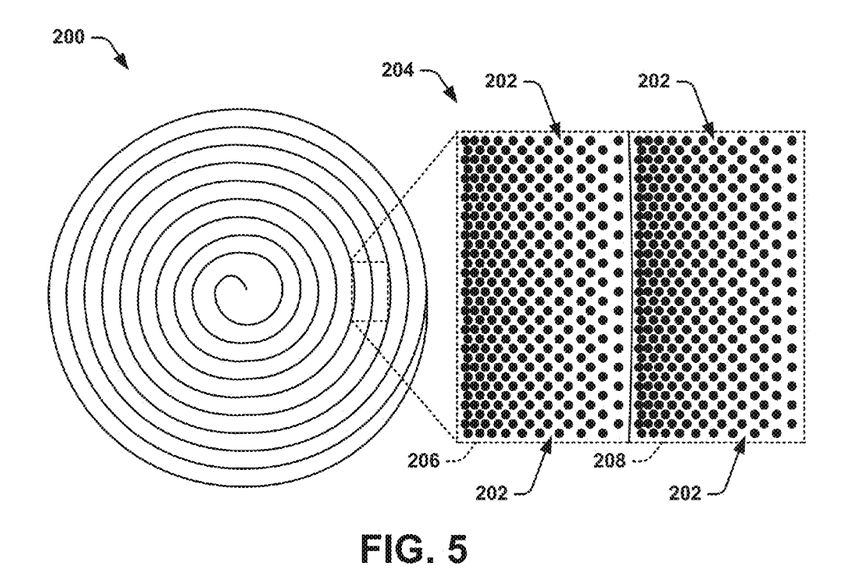
FIG. 5 illustrates another example of an HCG mode-control element.

FIG. 5 illustrates another example of a HCG mode control reflector 200. The HCG mode control reflector 200 can correspond to the HCG mode control reflector 16 in the example of FIG. 1 and/or the HCG mode control layer 106 in the example of FIG. 3. Therefore, reference is to be made to the examples of FIGS. 1 through 3 in the following description of the example of FIG. 5. The HCG mode control reflector 200 is demonstrated as circular in the top view of the example of FIG. 5. However, the HCG mode control reflector 200 can instead have a variety of different geometric shapes. As an example, the HCG mode control reflector 200 can have a diameter sufficient to provide selective phase-delays of substantially all or most of the resonating optical energy.

Similar to as described previously regarding the example of FIG. 4, the HCG mode control reflector 200 includes a layer of a high index-of-refraction material (e.g., amorphous silicon) provided as a plurality of resonant structures that are substantially arranged to provide mode control of incident optical energy, such as a spiral pattern defined as having a plurality of gradient patterns (e.g., loops) along a radius of the HCG mode control reflector 200. In the example of FIG. 5, the plurality of resonant structures can be provided as a plurality of posts 202 that are arranged as having a thickness (i.e., wafer thickness) that is substantially uniform on a substrate layer of a dielectric material (e.g., glass). As an example, the high index-of-refraction posts 202 can be surrounded by air, or can be surrounded by another material having an index-of-refraction that is less than the index-of-refraction of the posts 202 by at least one. Accordingly, the posts 202 cooperate to control the optical modes of the resonating optical energy based on the portions of the light resonating in the posts 202 to provide selective phase-delay of the resonating optical energy.

In the example of FIG. 5, the posts 202 are demonstrated as approximately cylindrical (i.e., round in the top-view of the example of FIG. 4) in an exploded view 204. For example, the posts 202 can be formed by etching the layer of the high index-of-refraction material. The posts 202 in each gradient pattern (e.g., loop) of the spiral pattern can have a width (e.g., diameter) that is substantially uniform and populate the substrate with a density that is based on a function of an approximate gradient of decreasing density from center of the HCG mode control reflector 200 to a periphery of the HCG mode control reflector 200. The substantially uniform width of the posts 202 can be sub-wavelength with respect to the light of the resonating optical energy (e.g., approximately 200 nm), and the density of the population of the posts 152 can be selected to provide selective phase-delay of the resonating optical energy, such as to provide an angular momentum to generate the approximately ring-shaped intensity profile. The exploded view 204 demonstrates an inner loop 206 and an adjacent outer loop 208 on which the posts 202 are pattern-etched. The inner loop 206 and the outer loop 208 each include posts 202 that populate the substrate with a density that decreases from left-to-right (e.g., from center of the HCG mode control reflector 200 to the outer periphery of the HCG mode control reflector 200). Accordingly, optical energy of the resonating optical energy can resonate within the posts 202 in a variable manner based on the variable density of population of the posts 202 to provide the selective phase-delay of the resonating optical energy, such as to provide the approximately ring-shaped intensity profile.

It is to be understood that the HCG mode control reflectors 150 and 200 are not intended to be limited to the examples of FIGS. 4 and 5. As an example, the HCG mode control reflectors 150 and 200 are not limited to including a spiral pattern arrangement of the resonant structures, but could instead include a variety of other types of arrangements. For example, the resonant structures could be provided in a different arrangement of one or more gradient patterns of the respective HCG mode control reflectors 150 and 200, such as concentric circles, ellipses, or other shapes. As another example, the gradient patterns are not limited to having the same dimensions, such as demonstrated with the loops in the examples of FIGS. 4 and 5, but could instead have varying dimensions (e.g., decreasing loop width closer to the edge of the HCG mode control reflectors 150 and 200). As yet another example, the resonant structures could be arranged in any of a variety of other ways that provide a substantially non-uniform resonance of optical energy incident thereon to provide sufficient mode control (e.g., to provide a substantially non-Gaussian intensity profile). In addition, a given lens as described herein can incorporate posts having both a variable width, such as described in the example of FIG. 4, and a variable density of population on the substrate, such as described in the example of FIG. 5. Furthermore, the posts 152 and 202 are not limited as being substantially cylindrical, but could instead have a variety of prismatic shapes. Accordingly, the HCG mode control reflectors 150 and 200 can be fabricated in any of a variety of ways.

Figure 6:
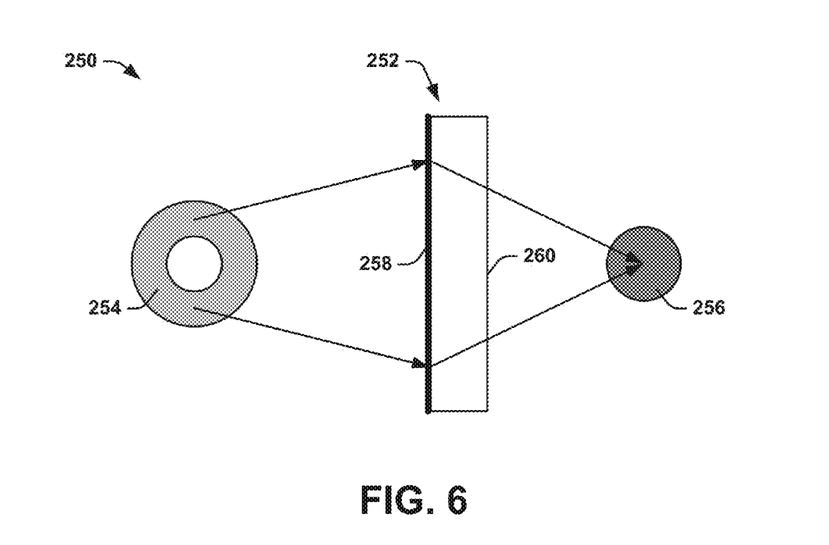
FIG. 6 illustrates an example diagram of mode conversion.

As described previously, the substantially non-Gaussian intensity profile of the optical signal $OPT_{SIG}$ can be converted to a different intensity profile (e.g., a single-mode Gaussian intensity profile), such as for launching the optical signal $OPT_{SIG}$ into an optical propagation device, such as an optical fiber or a waveguide. FIG. 6 illustrates an example diagram 250 of mode conversion. The diagram 250 demonstrates the intensity profile of the optical signal $OPT_{SIG}$ in a cross-sectional manner across both sides of a mode-converting HCG lens 252.

In the example of FIG. 6, the optical signal $OPT_{SIG}$ is demonstrated at 254 as having the substantially non-Gaussian intensity profile, such as based on mode control provided by the HCG mode control reflector 56 of the VCSEL 52 in the example of FIG. 2. The optical signal $OPT_{SIG}$ is thus provided to the mode-converting HCG lens 252, which is configured to convert the optical signal $OPT_{SIG}$ to a different intensity profile, demonstrated in the example of FIG. 6 as a single-mode Gaussian intensity profile at 256, such as can be focused onto the core of an optical propagation device (not shown in the example of FIG. 6). As an example, the optical signal $OPT_{SIG}$ can have been generated having a single mode in the active region of the VCSEL (e.g., the VCSEL 52). In the example of FIG. 6, the mode-converting HCG lens 252 is configured as a substantially planar HCG lens that includes a high index-of-refraction material layer 258 that includes a plurality of resonant structures on a dielectric layer 260. The plurality of resonant structures can be formed substantially similar to as described regarding the HCG mode control reflector 16 in the example of FIG. 1, such as surrounded by another material having an index-of-refraction that is less than the index-of-refraction of the high index-of-refraction material layer 258 by at least one and having a thickness sufficient to be transmissive of the optical signal $OPT_{SIG}$. Accordingly, the mode-converting HCG lens 252 operates as a lens to convert the optical modes of the optical signal based on the portions of the light resonating in the resonant structures, similar to as described herein.

Figure 7:
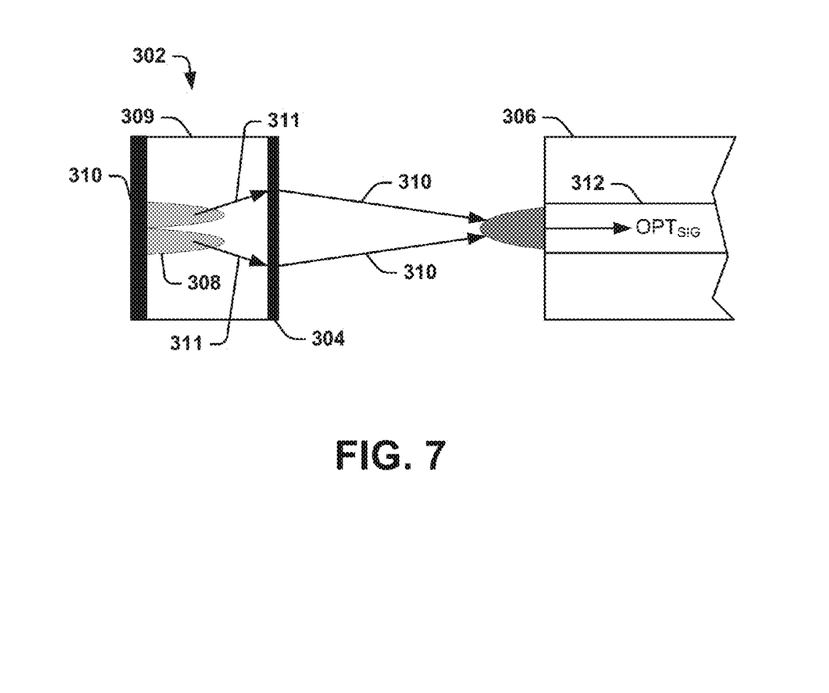
FIG. 7 illustrates an example of an optical coupling system.

FIG. 7 illustrates an example of an optical coupling system 300. The optical coupling system 300 is demonstrated in a plan view, and can be mounted on a PCB or a backplane to provide high-speed (e.g., 25 Gbps or more) optical communication in a computer system.

The optical coupling system 300 includes a VCSEL 302, a mode-converting HCG lens 304, and an optical propagation device 306, demonstrated in the example of FIG. 7 as an optical fiber (e.g., an optical fiber 306). It is to be understood that the optical propagation device could instead be implemented as an optical waveguide. The VCSEL 302 can be configured substantially similar to the VCSEL 100 in the example of FIG. 2, and can thus be configured to generate an optical signal 308 having a substantially non-Gaussian intensity profile. In the example of FIG. 7, the VCSEL 302 is demonstrated as arranged in a reverse manner, such that the optical signal 308 is emitted from a substrate 309. The mode-converting HCG lens 304 is demonstrated as coupled directly to the substrate 309 of the VCSEL 302 (e.g., through a low index-of-refraction film material), such as fabricated directly onto the substrate 309 of the VCSEL 302. Therefore, the optical signal 308 can be focused by the mode-converting HCG lens 304 upon passing through the substrate 309 to be launched into the core 312.

As an example, the VCSEL 302 can be implemented to provide high-speed (e.g., 25 Gbps or more) optical communications, and can thus have sufficient optical power to achieve such communication speed. As an example, the optical fiber 306 can be provided via a coupling mechanism, such as to provide the optical fiber 306 to a package that includes the VCSEL 302 and the mode-converting HCG lens 304. The optical signal 308 that is generated by the VCSEL 302 has an intensity profile that is mode-controlled via an HCG mode control reflector 310 and is provided to the mode-converting HCG lens 304, demonstrated by the lines 310, though the substrate 311. The mode-converting HCG lens 304 can be configured substantially similar to the mode-converting HCG lens 252 in the example of FIG. 6. Therefore, the mode-converting HCG lens 304 is configured to convert the optical signal 308 to a different intensity profile (e.g., the single-mode intensity profile 256). Accordingly, the optical signal 308 is focused and launched into a core 312 of the optical fiber 306 via the mode-converting HCG lens 304, demonstrated in the example of FIG. 7 as the optical signal 308 propagating in the core 312 of the optical fiber 306. While the different intensity profile is demonstrated in the example of FIG. 7 as a single-mode intensity profile, it is to be understood that the intensity profile provided by the mode-converting HCG lens 304 can be any of a variety of different types of intensity profiles, such as Gaussian, non-Gaussian, or a variety of other on-axis or off-axis shapes.

The optical coupling system 300 is not intended to be limited to the example of FIG. 7. As an example, the VCSEL 302 is not limited to being implemented as a reverse VCSEL that emits the optical signal 308 from the substrate, but could emit the optical signal 308 from the HCG mode-control reflector 311 instead. Furthermore, the mode-converting HGC lens 304 is not limited to providing the optical signal 308 to a propagation device, but could instead convert the mode of the optical signal 308 for a variety of other applications, such as optical disk storage, an optical mouse, imaging, laser printing devices, and a variety of other types of applications.

Figure 8:
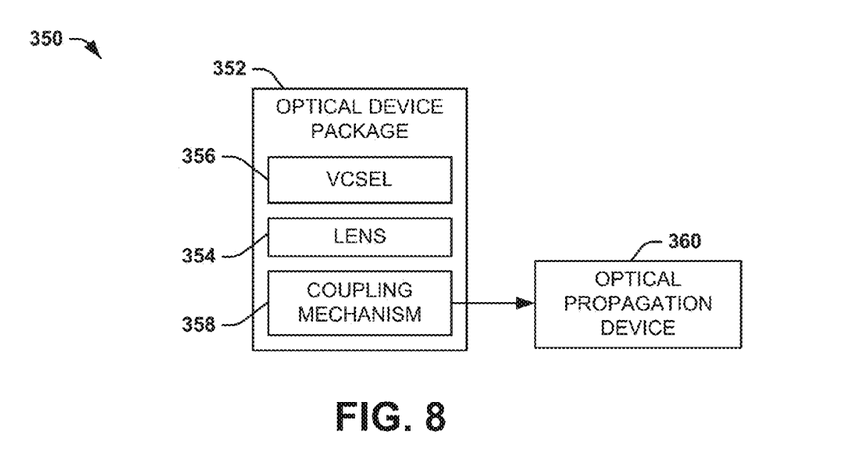
FIG. 8 illustrates another example of an optical coupling system.

FIG. 8 illustrates another example of an optical coupling system 350. The optical coupling system 350 can be configured as an optical transmission system, similar to as described in the example of FIG. 7. The optical coupling system 350 includes an optical device package 352 that includes a lens 354, a VCSEL 356, and a coupling mechanism 358. For example, the lens 354 can be configured as an HCG lens, similar to the lenses 252 or 304 as described in the respective examples of FIGS. 6 and 7. The coupling mechanism 358 is configured to receive an optical propagation device 360 (e.g., an optical fiber or an optical waveguide), such as multi-mode or single-mode. Accordingly, the VCSEL 356 can be configured to generate an optical signal, such as the optical signal 308, and the lens 354 can be configured to focus the optical signal to be coupled into the optical propagation device 360.

The optical device package 352 is not intended to be limited to including a single optical coupling system therein, such as to include only a single one of each of the lens 354, VCSEL 356, and coupling mechanism 358. For example, the optical device package 352 can include an array of optical coupling systems, such as to include a plurality of lenses 354, a respective plurality of VCSELs 356, and a respective plurality of coupling mechanisms 358. Therefore, a plurality of optical fibers 310 can be coupled to the respective plurality of coupling mechanisms 358.

Figure 9:
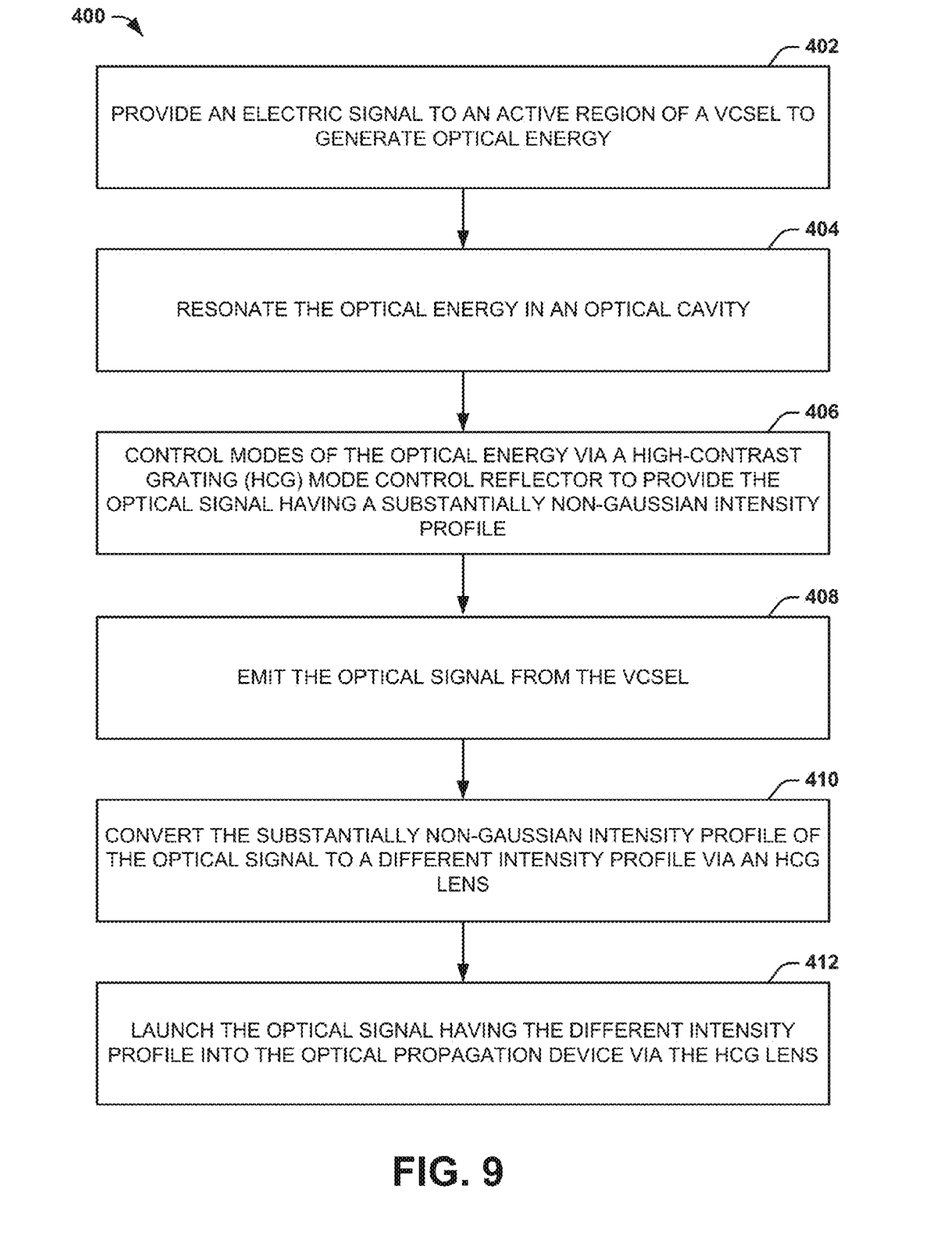
FIG. 9 illustrates an example method for coupling an optical signal from a VCSEL to an optical propagation device.

In view of the foregoing structural and functional features described above, a methodology in accordance with various aspects of the present invention will be better appreciated with reference to FIG. 9. While, for purposes of simplicity of explanation, the methodology of FIG. 9 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 9 illustrates a method 400 for coupling an optical signal (e.g., the optical signal $OPT_{SIG}$) from a VCSEL (e.g., the VCSEL 52) to an optical propagation device (e.g., the optical fiber 306). At 402, optical energy is generated in response to an electric signal (e.g., the electric signal $E_{SIG}$). At 404, the optical energy is resonated in an optical cavity. At 406, modes of the optical energy are controlled via an HCG mode control reflector (e.g., the HCG mode control reflector 16) to provide the optical signal having a substantially non-Gaussian intensity profile (e.g., the substantially non-Gaussian intensity profile 62). At 408, the optical signal is emitted from the VCSEL. At 410, the substantially non-Gaussian intensity profile of the optical signal is converted to a different intensity profile (e.g., the single-mode intensity profile 256) via an HCG lens (e.g., the mode-converting HCG lens 252). At 412, the optical signal having the different intensity profile is launched into the optical propagation device via the HCG lens.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A mode-controlled laser system comprising:
an active region to generate optical energy in response to an electric signal;
a mirror to resonate the optical energy in an optical cavity;
a high-contrast grating (HCG) mode control reflector arranged in the optical cavity to control the resonated optical energy into a substantially non-Gaussian ring-shaped intensity profile, such that the resonated optical energy is emitted as an optical signal having the substantially non-Gaussian ring-shaped intensity profile; and
an optical coupling system comprising a mode-converting HCG lens to convert the substantially non-Gaussian ring-shaped intensity profile of the optical signal to a Gaussian intensity profile;
wherein the HCG mode control reflector comprises a plurality of resonant structures that are arranged in a spiral gradient pattern across a surface of the HCG mode control reflector.

2. The system of claim 1, wherein the plurality of resonant structures are one of sub-wavelength in dimension or fabricated from a first material and are substantially surrounded by a second material, wherein a difference between an index-of-refraction of the first material and an index-of-refraction of the second material is greater than or equal to one.

3. The system of claim 1, wherein the gradient pattern is defined as the plurality of resonant structures having variable dimensions defined by a gradient.

4. The system of claim 1, wherein the spiral gradient pattern comprises a plurality of loop gradient patterns that extend along a radius of the HCG mode control reflector.

5. The system of claim 1, wherein the HCG mode control reflector is arranged as a reflective element that is to cooperate with the mirror to resonate the optical energy in the optical cavity.

6. The system of claim 1, further comprising another mirror interconnecting the HCG mode control reflector and the active region and being to cooperate with the mirror to resonate the optical energy in the optical cavity.

7. The system of claim 1, wherein the mode-controlled laser system is arranged as a vertical-cavity surface-emitting laser (VCSEL), and wherein the active region is arranged as an active region layer of the VCSEL, wherein the mirror is arranged as a reflective layer of the VCSEL.

8. The system of claim 1, wherein the non-Gaussian ring-shaped intensity profile is generated as a single-mode non-Gaussian ring-shaped intensity profile with respect to a single mode of the active region.

9. The system of claim 1, wherein the spiral pattern includes the plurality of gradient structures arranged in loops along a radius of the HCG mode control reflector.

10. The system of claim 2, wherein the plurality of resonant structures are a plurality of cylindrical posts.

11. The system of claim 10, wherein widths of the plurality of posts decrease in a direction from a center of the HCG mode control reflector to a periphery of the HCG mode control reflector.

12. A method, comprising:
providing an electric signal to an active region of a vertical-cavity surface-emitting laser (VCSEL) to generate optical energy;
resonating the optical energy in an optical cavity;
controlling modes of the optical energy via a high-contrast grating (HCG) mode control reflector to provide the optical signal having a substantially non-Gaussian ring-shaped intensity profile, the HCG mode control reflector comprising a plurality of resonant structures that are arranged in a spiral gradient pattern across a surface of the HCG mode control reflector;
emitting the optical signal from the VCSEL;
converting the substantially non-Gaussian ring-shaped intensity profile of the optical signal to a Gaussian intensity profile via a mode-converting HCG lens; and
launching the optical signal having the Gaussian intensity profile into an optical propagation device via the HCG lens.

13. The method of claim 12, wherein resonating the optical energy comprises resonating the optical energy in the optical cavity that is defined by a mirror and the HCG mode control reflector that each cooperate to reflect the optical energy in the optical cavity.

14. The method of claim 12, wherein the spiral gradient pattern is defined as the plurality of resonant structures having variable dimensions defined by a gradient.

15. A vertical-cavity surface-emitting laser (VCSEL) comprising:
- an active region layer to generate optical energy in response to an electric signal;
- a mirror layer to resonate the optical energy in an optical cavity;
- a mode control layer comprising a high-contrast grating (HCG) mode control reflector and arranged in the optical cavity to control the resonated optical energy into a substantially non-Gaussian ring-shaped intensity profile, the HCG mode control reflector comprising a plurality of resonant structures that are defined by a spiral gradient pattern across a surface of the HCG mode control reflector, such that the resonated optical energy is emitted as an optical signal having the non-Gaussian ring-shaped intensity profile; and
- an optical coupling mechanism comprising a mode-converting HCG lens connecting the VCSEL with the optical coupling mechanism to receive the optical signal and convert the non-Gaussian ring-shaped intensity profile of the optical signal to a Gaussian intensity profile.

16. An optical device package comprising the VCSEL of claim 15, the package further comprising an optical propagation device of the coupling mechanism that is to receive the optical signal with the Gaussian intensity profile from the HCG lens.

17. The method of claim 15, wherein the gradient pattern of the HCG mode control reflector is defined as the plurality of resonant structures having approximately equal dimensions.

18. The VCSEL of claim 15, wherein the HCG mode control reflector is directly coupled to a distributed Bragg reflector (DBR) located between the mode control layer and the active region layer.

* * * * *